US 8,975,964 B2

(12) United States Patent
Li et al.

(10) Patent No.: US 8,975,964 B2
(45) Date of Patent: Mar. 10, 2015

(54) BEMF MONITOR GAIN CALIBRATION STAGE IN HARD DISK DRIVE SERVO INTEGRATED CIRCUIT

(71) Applicant: Texas Instruments Incorporated, Dallas, TX (US)

(72) Inventors: Qunying Li, Allen, TX (US); Wenxiao Tan, Murphy, TX (US); Gregory Swize, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 114 days.

(21) Appl. No.: 13/759,848

(22) Filed: Feb. 5, 2013

(65) Prior Publication Data

US 2013/0200954 A1    Aug. 8, 2013

Related U.S. Application Data

(60) Provisional application No. 61/625,485, filed on Apr. 17, 2012, provisional application No. 61/595,340, filed on Feb. 6, 2012.

(51) Int. Cl.
*H03G 3/00* (2006.01)
*H03G 1/00* (2006.01)

(52) U.S. Cl.
CPC ............... *H03G 3/00* (2013.01); *H03G 1/0088* (2013.01); *H03G 3/001* (2013.01)
USPC .............. 330/282; 330/86; 330/144; 330/284

(58) Field of Classification Search
CPC .................................................... H03G 1/0088
USPC ..................................... 330/86, 144, 282, 284
See application file for complete search history.

(56) References Cited

U.S. PATENT DOCUMENTS

| 5,523,721 A * | 6/1996 | Segawa et al. .................. 330/86 |
| 6,538,508 B2 * | 3/2003 | Cheung et al. .................. 330/86 |
| 2007/0075769 A1 * | 4/2007 | Blon ............................. 330/86 |

* cited by examiner

*Primary Examiner* — Robert Pascal
*Assistant Examiner* — Khiem Nguyen
(74) *Attorney, Agent, or Firm* — Alan A. R. Cooper; Frederick J. Telecky, Jr.

(57) ABSTRACT

A high performance digitalized Programmable Gain Amplifier (PGA). In prior art circuit, a dual-ladder DAC is employed for gain control, the back gate leakage of NMOS resistors in the fine ladder conquers fine ladder nominal current and it produces non-monotonic gain scallop. Two new art design techniques: (1) adaptively control the fine ladder; and (2) use dummy PMOS brunch device leakage compensates for the NMOS resistor device leakage, are proposed so that the non-monotonic scallops are substantially eliminated and 13-bit resolution/accuracy PGA has been achieved.

14 Claims, 7 Drawing Sheets

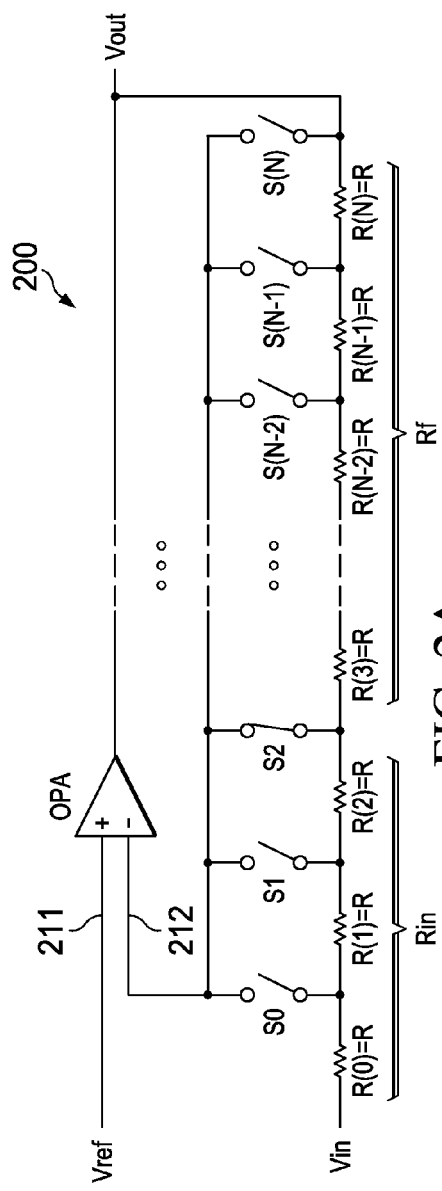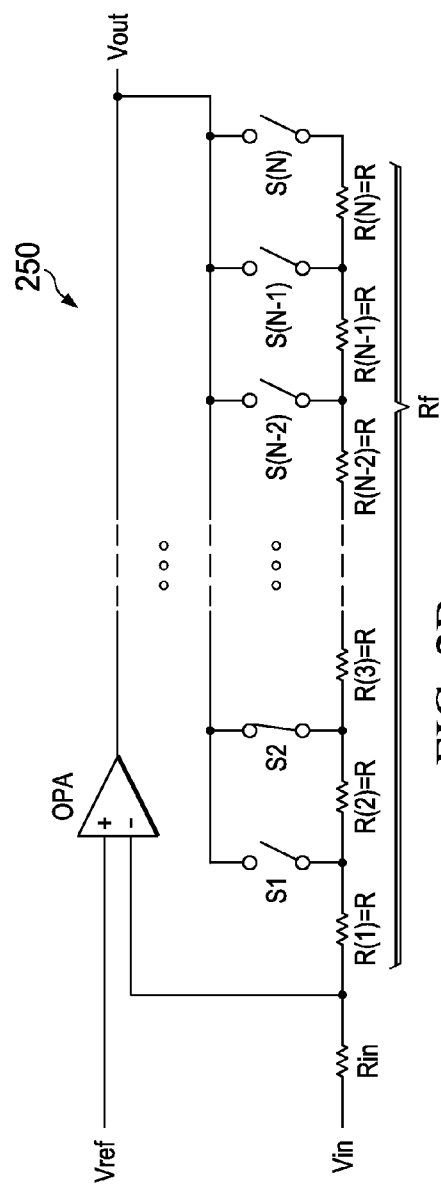
FIG. 2A (PRIOR ART)
FIG. 2B (PRIOR ART)

BEMF MONITOR GAIN CALIBRATION STAGE IN HARD DISK DRIVE SERVO INTEGRATED CIRCUIT

PRIORITY

This application claims priority to U.S. Provisional Application No. 61/595,340, filed Feb. 6, 2012, entitled "BEMF Monitor Gain Calibration Stage in HDD Servo IC", which is incorporated by reference in its entirety. This application also claims priority to U.S. Provisional Application No. 61/625,485, filed Apr. 17, 2012, also entitled "BEMF Monitor Gain Calibration Stage in HDD Servo IC", which is also incorporated by reference in its entirety.

TECHNICAL FIELD

This application is directed, in general, to amplifiers in Hard Disk Drives (HDD) servo system and, more specifically, to a gain calibration of an amplifier in monitoring back electro-motive force (BEMF) of VCM motor in servo integrated circuits (ICs).

BACKGROUND

FIG. 1 illustrates a prior art BEMF system 100 having an A1 gain amplifier 110 of a Voice Coil Motor (VCM) 120 BEMF monitor in HDD servo IC.

In gain calibration mode, the VCM motor 120 is made still so its BEMF voltage is zero. Meanwhile, about 100 mA current is forced flowing through VCM motor and sense resistor Rs. The voltage drop on the sense resistor Rs is amplified by a digital programmable gain amplifier A1, and the A1 gain output is cancelled out with VCM voltage at A2 gain stage 130. Make A2 output zero by digitally changing A1 gain, A1 amplifier 110 gain is digitally calibrated to be equal to a ratio of motor resistance $R_{VCM}$ and sense resistance $R_{SNS}$, that is, $$A1\,Gain = \frac{R_{VCM}}{R_{SNS}}.$$

In BEMF normal operation mode while VCM BEMF voltage presents, the current-resistance-product item of Rs is gained up by the calibrated A1 gain and is subtracted from the voltage across the VCM at A2 stage, that is, $$V_{A2OUT} = V_{VCM} - V_{A1OUT} = (V_{VCM\_BEMF} + I \times R_{VCM}) - I_{VCM} \times R_{SNS} \times A1\,Gain = V_{VCM\_BEMF} \quad \text{Equation (1)}$$

As shown in Equation (1), A2 amplifier 130 output is an estimation of VCM motor BEMF voltage. In modern HDD servo IC circuits, a 13-bit DAC is used for A1 programmable gain stage 110 to achieve required mV-level BEMF voltage measurement accuracy.

FIGS. 2A and 2B illustrate two prior art Programmable Gain Amplifier (PGA) approaches to BEMF monitor gain calibration of A1 gain 110. In FIG. 2A, switches of a first prior art PGA 200 performing gain programmability are tied to an operational amplifier's (OPA's) negative input node, and the switch on-state resistance $R_{ds,on}$ does not contribute to PGA gain error, because of an infinite impedance, thus zero input bias current to the inputs 211 and 212 of CMOS OPA.

However, the scheme of the PGA 200 also has a disadvantage. The gain is not linear to resistance increment/decrement which is linearly coded by switches S0-S(N). For example, in FIG. 2A, suppose N=63 (i.e., 64 switches/resistors in total) and the resistance between every node tapped out by switches are evenly equal to a given resistance R. When the digital input changes from code X='00H' (switch S0 is turned on and all others are off) to X='01H' (switch S1 is turned on and all others are off) and then to X='02H' (switch S2 is turned on and all others are off), the PGA 200 gain, which is $R_f/R_{in}$, moves from 63 to 62/2 then to 61/3 which are non-linear gain steps. In other words, the PGA 200 does not have a linear transfer function although the digital code linearly changes. This lack of linearity does not meet system level requirements for typical servo systems.

In FIG. 2B, an alternative prior art PGA 250 of the A1 gain 110, the input resistance $R_{in}$ between input Vin and the OPA negative input node is fixed, and the feedback resistance $R_f$ is linearly coded by switches. As a result, the gain of the PGA 250 of an A1 PGA 110 is a linear function of the linearly coded resistance. For example, when digital code X="00H" (switch S1 is turned on and all other switches are off) moves to X="01H" (S2 is turned on and all others are off) then to X="02H" (switch S3 is turned and all others are off) and finally moves to X="3FH" (switch S(64) is turned on and all others are off), the gain $R_f/R_{in}$ changes from to $$\frac{R + R_{S1,on}}{R_{in}}$$

to $$\frac{2R + R_{S2,on}}{R_{in}} \text{ then to } \frac{3R + R_{S3,on}}{R_{in}} \text{ and finally } \frac{64R + R_{S64,on}}{R_{in}}.$$

The A1 gain is linear to the digital code change only when the switch on-state resistances are ideally zero.

Disadvantageously, however, in the prior art PGA 250 of FIG. 2B, the switch on-state resistances S1-SN, are in the signal path and they contribute to the amplifier gain error, unlike the prior art PGA 200. Furthermore, the switch resistances S(1)-S(N) and the poly resistors R(N) that create the gain for the PGA 250 have different temperature coefficients and voltage coefficients, and it can traverse into gain error over temperature variation and over voltage signal excursion during the operation.

Moreover, to succeed in high-volume product business such as HDDs, it is important to decrease circuit element counts and silicon area, for such reasons as saving cost of the IC controlling the HDD servo mechanism. In the discussed prior art PGAs, implementing single-ladder architecture of 13-bit programmable gain needs $2^{13}$=8192 count of resistors and switches. This is unacceptable for most high-volume HDD servo IC applications.

FIG. 3 shows a prior art dual ladder DAC, with NMOS resistors used in the fine ladder forming a 13 bit programmable PGA. FIG. 3 illustrates a prior art dual-ladder architecture of 6+7, that is, implementing 6-bit in a coarse ladder and 7-bit in a fine ladder. This avoids the large number of switches and resistors used in either the PGA 200 or the PGA 250. The circuit complexity is reduced to $2^6+2^7$=192 count of switches and resistors, which is about 43 times less complex in terms of used switches/resistors, compared to the single-ladder architecture of 13 bit resolution.

In the dual-ladder DAC architecture 300 of the A1 gain 110, to minimize DNL/INL error over process and temperature variations, (1) The resistance of on-state switch 321 and 322 between a coarse ladder 310 and a fine ladder 320 are considered as one unit of the fine ladder 320; (2) MOS resistors 323, 324, 325, 326 are used in the fine ladder 320, where a MOS resistor is defined as a MOS device working in deep triode region. Therefore, all the units along the fine ladder are same type of elements and they match with each other very well (over temperature and process variations) and the DAC DNL/INL performance is improved and silicon area is reduced.

However, a trade-off exists regards PGA 300 performance and the ratio between the fine ladder 320 total resistance $N \times R_{FL}$ (where N is fine ladder 320 MOS resistor count) and the coarse ladder 310 unit resistance $R_{CL}$, which is chosen to shunt with the fine ladder 320 for a specific input digital code. If ratio $(N \times R_{FL})/R_{CL}$ is smaller than a certain value, a "shunt effect" degrades the DAC DNL/INL performance. This is because when the fine ladder 320 is switched and shunted to a specific coarse ladder resistor R1, the effective resistance of the shunted unit is relatively less than it used to be. In implementations, the error caused by the shunt effect $$1 - \frac{R_{CL} // (NR_{FL})}{R_{CL}}$$

should be less than 0.5LSB. To reach the goal, $R_{FL}$ should be designed larger than a specific value. On the other hand, if ratio $(N \times R_{FL})/R_{CL}$ is too large and over a certain threshold, the nominal current flowing through the fine ladder 320 is so small that it is conquered by the current leakage in the fine ladder 320.

In PGA 300, if equal resistances are used in the coarse ladder 310, the resulting programmable gain is not linear to the digital code as illustrated as line 330. To obtain the linear gain as line 331, the resistances in the coarse ladder 310 have to be carefully computed and they must not be equal.

As shown in FIG. 4 of a prior art PGA 400 and as understood and discovered by the present inventors, the fine ladder 420 nominal current is mostly leaked away locally at the back gate parasitic p-n junction diodes 424 and 425 in MOS resistors 421, back gate parasitic p-n junction diodes 426 and 427 in MOS resistor 422 and so on, as well as back gate parasitic p-n junction of switches 431, 432 and so on, all associated with the fine ladder 420. When ratio $(N \times R_{FL})/R_{CL}$ is too large and the nominal current flowing through fine ladder 420 is small and comparable to leakage current, the net current goes through fine ladder MOS resistor channel notably decreases due to local MOS back gate leakage. That is, Ids1>Ids2>Ids3>Ids4 and so on until to some point, the MOS channel current is completely conquered by local leakage current and become zero. After that, the local leakage current is provided by a current coming from a reversed direction. Thus the net current direction flowing through the MOS resistor channel on the right end of the fine ladder 420, for example devices 426 and 427, are reversed to what it is supposed to be. The "leakage effect" causes the net current flowing through the prior art fine ladder 420 is not maintained in a consistent direction, therefore the voltage potential along the fine ladder does not monotonically decreases and it produces unacceptable non-monotonic gain scallop.

As understood by the present inventors, to achieve 13 bit resolution/linearity and minimize silicon area consumption, which is important to high volume HDD servo products, the error due to 'shunt effect' needs to be less than 0.5LSB, thus MOS resistors are used in the DAC fine ladder 420 and its resistances are designed to be much larger than the coarse ladder 410 unit resistance, that is, a large ratio $(N \times R_{FL})/R_{CL}$.

An undesired side-effect, however, is that the nominal current of the fine ladder 420, which is a ratio $R_{CL}/(N \times R_{FL}+R_{CL})$ of the total current from Vin to Vout of the PGA stage, become extremely small. It is comparable to or even conquered by the back gate current leakage of the fine ladder 420 MOS resistor 421, 422 . . . and DAC switches 431, 432 and so on. It causes non-linear scallop and damages 13 bit resolution/linearity performance, especially when the voltage input to the A1 gain stage is small and therefore the nominal current flowing through fine ladder is very small.

Therefore, there is a need in the art as understood by the present inventors to address a design challenge is to balance between the "shunt effect" and the "leakage effect" and remove the non-monotonic scallop, wherein resistance in the coarse ladder is unevenly set to achieve linear coded programmable gain.

SUMMARY

A first aspect provides an apparatus including a hard drive preamplifier, the hard drive preamplifier including: a coarse ladder having a plurality of resistors, wherein each of the plurality of resistors are individually addressable; a fine ladder that is coupled to the coarse ladder, wherein the find ladder includes a plurality of banks of FETs, each bank including a plurality of FETs, and a fine ladder controller, wherein the each of the plurality of banks of the fine ladder are controllable by the fine ladder controller.

A second aspect provides a system including a hard drive preamplifier, the hard drive preamplifier including: a first amplifier having a first gain, the first amplifier including a coarse ladder having a plurality of resistors, wherein each of the plurality of resistors are individually addressable; a fine ladder that is coupled to the coarse ladder, wherein the find ladder includes a plurality of banks of FETs, each bank including a plurality of FETs, and a fine ladder controller, wherein the each of the plurality of banks of the fine ladder are controllable by the fine ladder controller, a second amplifier having a second gain, a summer coupled to an output of the first gain and the second gain.

A third aspect provides a system a system including a hard drive preamplifier, the hard drive preamplifier including: a first amplifier having a first gain, the first amplifier including a coarse ladder having a plurality of resistors, wherein each of the plurality of resistors are individually addressable; a fine ladder that is coupled to the coarse ladder, wherein the find ladder includes a plurality of banks of FETs, each bank including a plurality of FETs, and a fine ladder controller, wherein the each of the plurality of banks of the fine ladder are controllable by the fine ladder controller, a second amplifier having a second gain, a summer coupled to an output of the first gain and the second gain, wherein, each of the FETs is an NFET, wherein a PMOS is coupled to each corresponding NFET.

BRIEF DESCRIPTION OF THE DRAWINGS

Reference is now made to the following descriptions:

FIG. 2A illustrates a first prior art PGA of the BEMF programmable gain amplifier of FIG. 1;

FIG. 2B illustrates a second prior art PGA of the BEMF programmable gain amplifier of FIG. 1;

DETAILED DESCRIPTION

Figure 1:
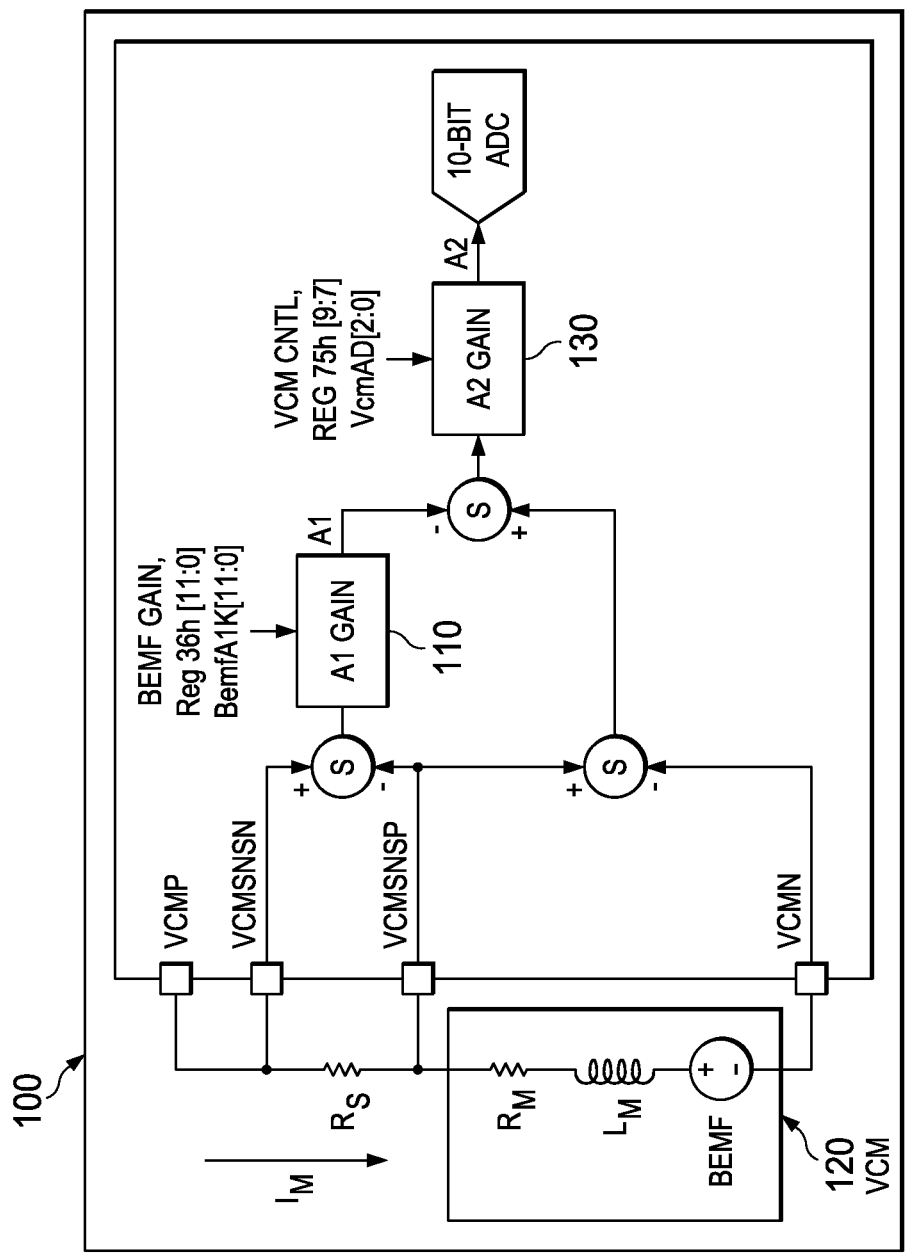
FIG. 1 illustrates BEMF monitor 100 with a BEMF digital programmable gain amplifier.
Figure 3:
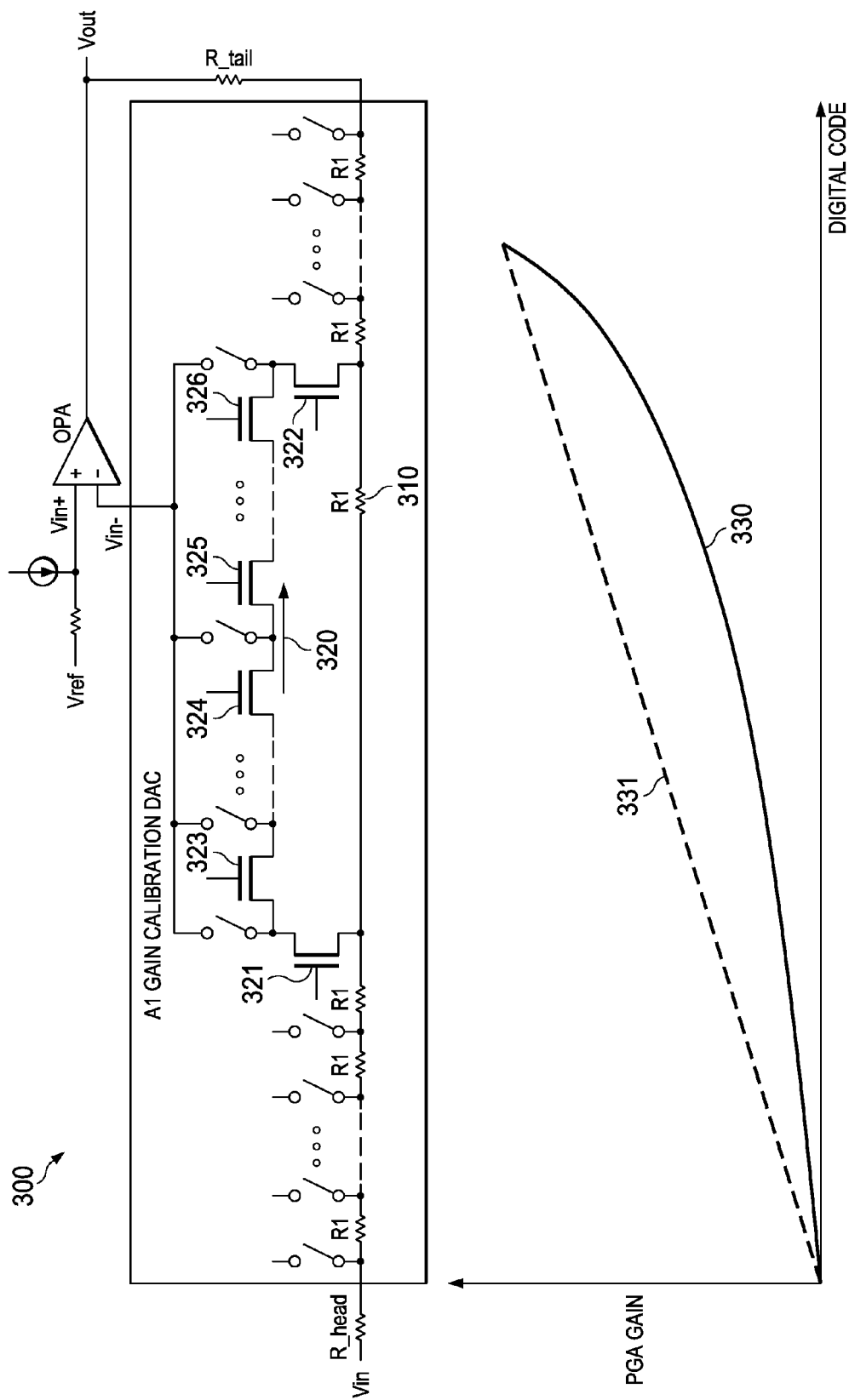
FIG. 3 illustrates a prior art PGA 300 where design trade off of "shunt effect" and 'leakage effect" simultaneously exist.
Figure 4:
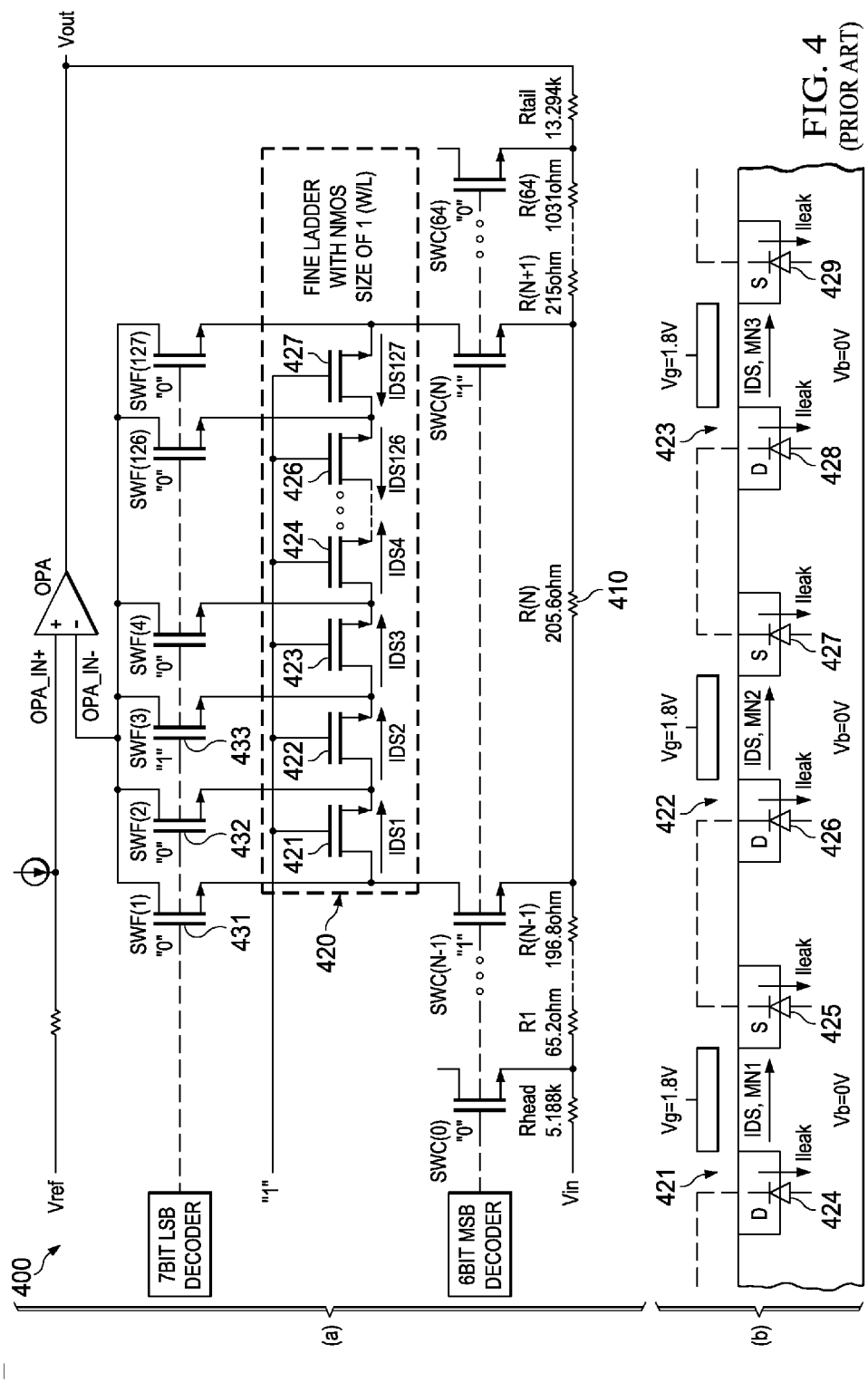
FIG. 4 illustrates a prior art PGA 400 where the back gate current leakage conquer the nominal fine ladder current, the voltage potential along the fine ladder does not monotonically decreases and non-linear gain scallop occurs.

Turning to FIG. 4, illustrated is one aspect, to avoid the on-state switch resistance effect and achieve 13-bit resolution and accuracy on the programmable gain amplifier, the schematic in FIG. 2A (with no Rdson effect on gain accuracy) has been chosen and it is improved to be linear with respect to the programming code. To achieve linear gain in the schematic FIG. 4, every resistance unit in the coarse ladder should be carefully calculated. Given a minimum gain $G_{MIN}$ and a maximum gain $G_{MAX}$ and a targeted coarse ladder resolution implementation (e.g. 6 bit), following equations (2), (3), (4) should be used to determine every resistor value in the coarse ladder and the result turns out to be $R_{head}$=5.188 Kohm, $R_1$=65.18 ohm, $R_2$=66.84 ohm, $R_3$=68.56 ohm ... $R_{64}$=1031 ohm, $R_{tail}$=13.294 Kohm for a specific design.

$$G_{MIN} = \frac{R_{Tail}}{R_{Head} + \sum_{I=1}^{64} R_I} \quad \text{Equation (2)}$$

$$G_{MAX} = \frac{\sum_{I=1}^{64} R_I + R_{Tail}}{R_{Head}} \quad \text{Equation (3)}$$

$$\frac{R_{Tail} + \sum_{I=K+1}^{64} R_I}{R_{Head} + \sum_{I=1}^{K} R_I} = G_{MIN} + \frac{G_{MAX} - G_{MIN}}{64} \times K \quad \text{Equation (4)}$$

Although the coarse ladder resistance calculation in previous paragraph makes the PGA gain linear to the input programming code, there are practical issues with the circuit operation. It is difficult to use a fixed fine ladder design to simultaneously meet PGA accuracy requirement at both following cases. Case (1): when the fine ladder is shunted with R1 (the minimum resistance of the fine ladder, then the fine ladder current is smallest and easily conquered by leakage, thus the leakage effect dominantly degrades PGA performance and scallop appears), and case (2): when the fine ladder is shunted with R(64) (the maximum resistance of the coarse ladder, then the shunt effect get to its peak point and dominantly degrades the PGA performance).

Figure 5:
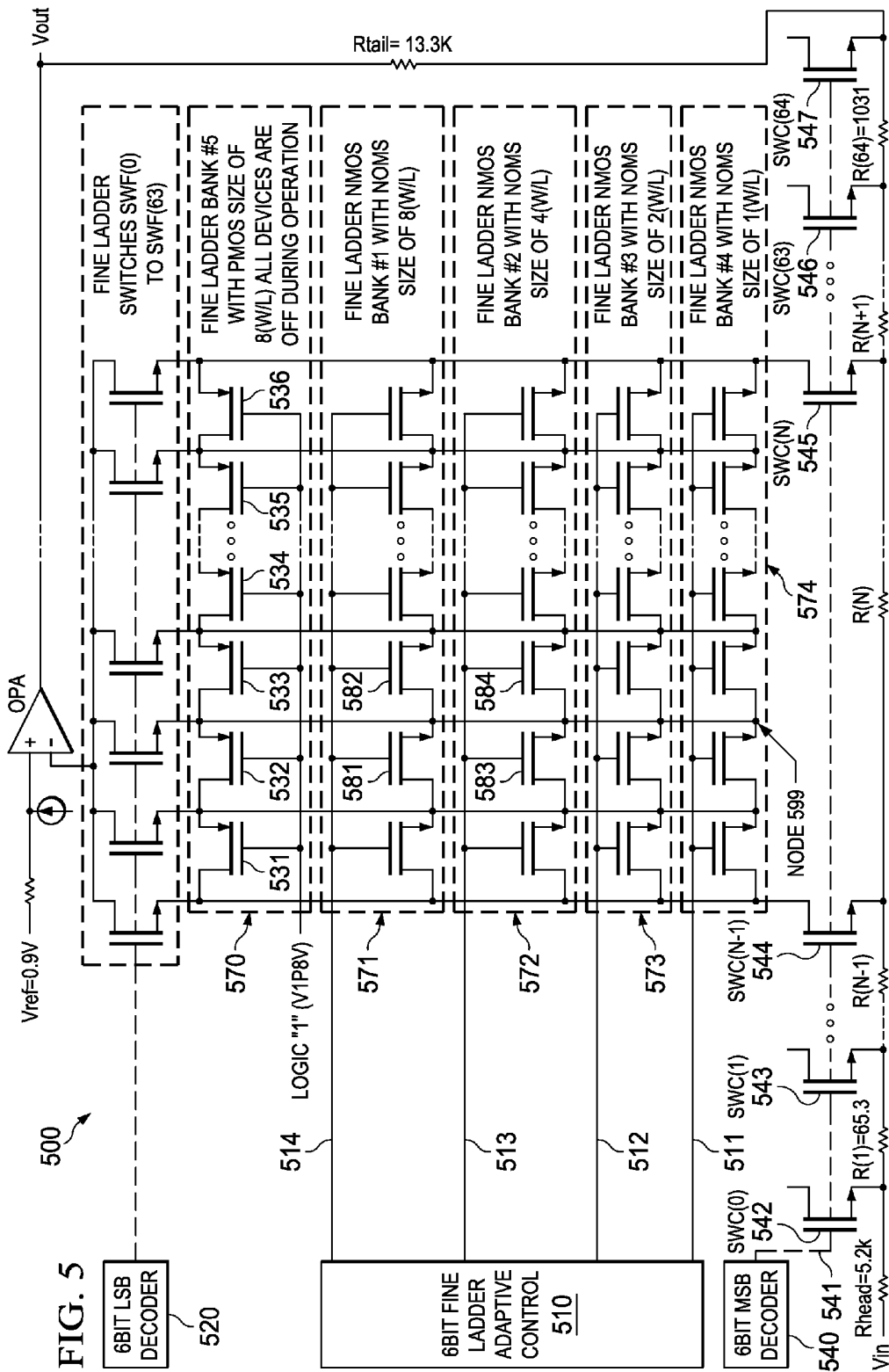
FIG. 5 illustrates a new art BEMF programmable gain amplifier 500 having a plurality of levels of fine ladder adaptive control and back gate leakage current compensation.

In FIG. 5, illustrated is a circuit 500 for new art PGA in servo BEMF monitor circuit. In the circuit 500, an adaptive control on the fine ladder depends on which coarse ladder resistor is shunted so the ratio $(N \times R_{FL})/R_{CL}$ is adaptively adjusted, therefore the net current flowing through every unit in the fine ladder is kept relatively constant.

For example, when 6 bit MSB decoder process digital input MSB bit <11:6> and its output turn on switches SWC(0) 542 and SWC(1) 543, fine ladder is shunted with the coarse resistor R1=65.3 ohm, which is the minimum in the coarse resistance from R(1) to R(64). Meanwhile, the fine ladder adaptive control logic circuit 510 set all output control signal 511, 512, 513 514 'high', so that all four NMOS resistor banks (respectively with MOS resistor of aspect ratio 8(W/L), 4(W/L), 2(W/L), 1 (W/L), 1 (W/L)) are turned on, and equivalent fine ladder resistance of 64*R2/16=4R2 is shunted with R1. Therefore, when the smallest coarse ladder resistance R1 is chosen to be shunted, the fine ladder resistance is adaptively adjusted be its smallest, to keep the fine ladder current, which is a ratio R1/(R1+4R2) of total current, be a constant and far away from the level easily conquered by leakage current.

When 6 bit MSB decoder process input MSB bit<11:6> and output turn on switches SWC(63) 535 and SWC(64) 536, the fine ladder is shunted with the coarse resistor R(64)=1031 ohm, which is the maximum in the coarse resistance from R(1) to R(64). Meanwhile, the fine ladder adaptive control logic circuit 510 set output control signal 511 'high' and other control signal 512, 513 514 'low', so that only one fine ladder bank with MOS resistor aspect ratio 1*(W/L) is turned on and all other three NMOS resistor banks (respectively with MOS resistor of aspect ratio 8(W/L), 4(W/L), 2(W/L) are turned off, and equivalent fine ladder resistance of 64*R2 is shunted with R(64). Therefore, when the largest coarse ladder resistance R(64) is chosen to be shunted, the fine ladder resistance is also adaptively adjusted be its largest, to keep the fine ladder current, which is a ratio R(64)/(R(64)+64*R2) of total current, be a constant and far away from the level easily conquered by leakage current.

In a general case, when 6 bit MSB decoder process input MSB bit<11:6> and output turn on two switches SWC(N−1) and SWC(N) associated with an arbitrary resistor R(N), the fine ladder is shunted with the coarse resistor R(N). Meanwhile, the fine ladder adaptive control logic circuit 510 set some of control signals 511, 512,513,514 'high' and the rest of control signals 'low', so that a combination of fine ladder banks with MOS resistor aspect ratio i*(W/L), where i=1, 2, 3, 4, is turned on and all other NMOS resistor banks are turned off, and an equivalent fine ladder resistance of 64*R2/j, where j=1 to 16, is shunted with R(N). Therefore, the fine ladder current, which is a ratio R(N)/(R(N)+64*R2/j) of total current, is relatively a constant and far away from the level easily conquered by leakage current. Because the aspect ratio of the fine ladder MOS resistor are binary scaled so an effective of fine ladder resistance of 64*R2/j, where j=1, 2, 3, 4 ... 16 can be adaptively shunted with the corresponding coarse ladder resistor and keep the current flowing through the fine ladder is relatively an constant.

In a further aspect of PGA 500, a bank of PMOS devices 570 is parallel coupled with the NMOS banks 571, 572, 573, 574. The PMOS bank 570 has exactly same device count and each device is parallel tied to the corresponding each NMOS device in NMOS banks During the operation, the gate of each PMOS device in the PMOS bank 570 is permanently connected to logic "1", so that the PMOS devices are turned off all the time during the operation. It seems the PMOS bank 570 is turned off and it is out of circuit operation, however, the back gate leakage currents of the PMOS devices (the leakage current flows through PMOS source/drain parasitic diode from 1.8V back gate NWELL to its source/drain) are used to compensate for the local leakage current generated by the NMOS devices (the leakage current flows from NMOS drain/source to back gate substrate ground).

Figure 6:
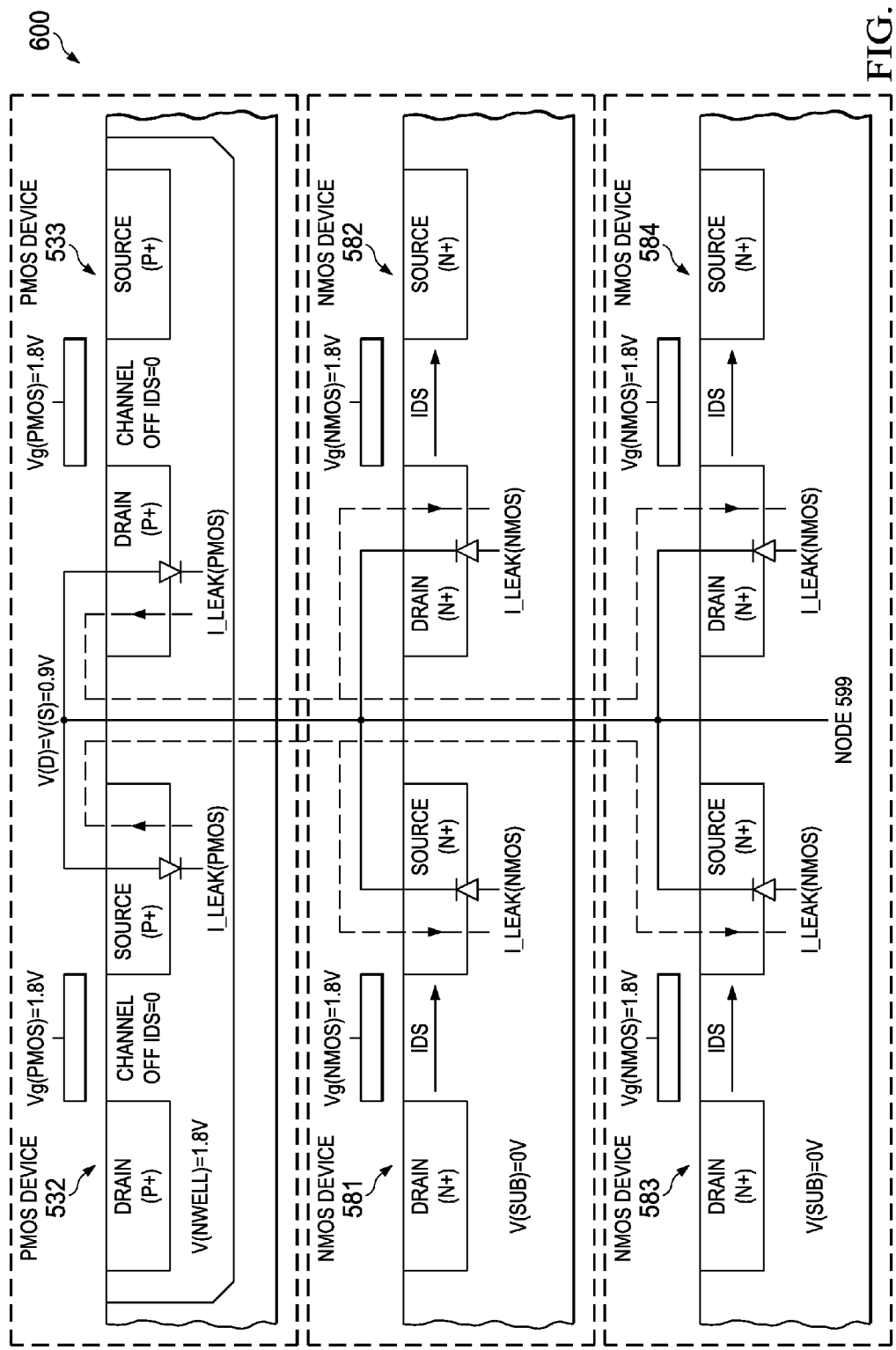
FIG. 6 illustrates that the back gate leakage current of NMOS devices associated with node 599 is locally compensated by PMOS devices back gate leakage current.

As a result, shown in FIG. 6, the back gate leakage current of NMOS parasitic diodes is provided by a local PMOS back-gate leakage current. Note that in FIG. 6, only PMOS devices 532,533 and NMOS devices 581, 582, 583, 584, all associated with node 599, have been drawn for simplicity. The channels of fine ladder MOS resistors experience same amount net current from the beginning to the end along the fine ladder, without being distracted by local leakage current. Therefore the current flowing through the fine ladder is consistently in one direction and it is far away the current level conquered by the leakage current, thus the non-linear scallop described earlier has been eliminated.

During the PGA 500 circuit operation, because of OPA virtual ground principle, the voltage potential of the every node of the finer ladder, as well as the two ends of the coarse ladder resistor which is chosen to be shunted with, are all close to VREF=0.9V. Thus, the voltage across the NMOS and PMOS back gate parasitic diodes constantly remains at about 0.9V, the leakage current going through the back gate diodes of either NMOS or PMOS are constant during the operation. The leakage current from PMOS device tied to one node compensates for all nMOS devices tied with the associated node. Note that the PMOS/NMOS back gate leakage is independent of the PMOS/NMOS on or off state, therefore the back gate of the PMOS and NMOS banks in the fine ladder presents a constant leakage current all the time, no matter how many number of the NMOS banks are turned on or turned off. That is, the leakage compensation is independent of the adaptive control operation of NMOS banks.

Figure 7:
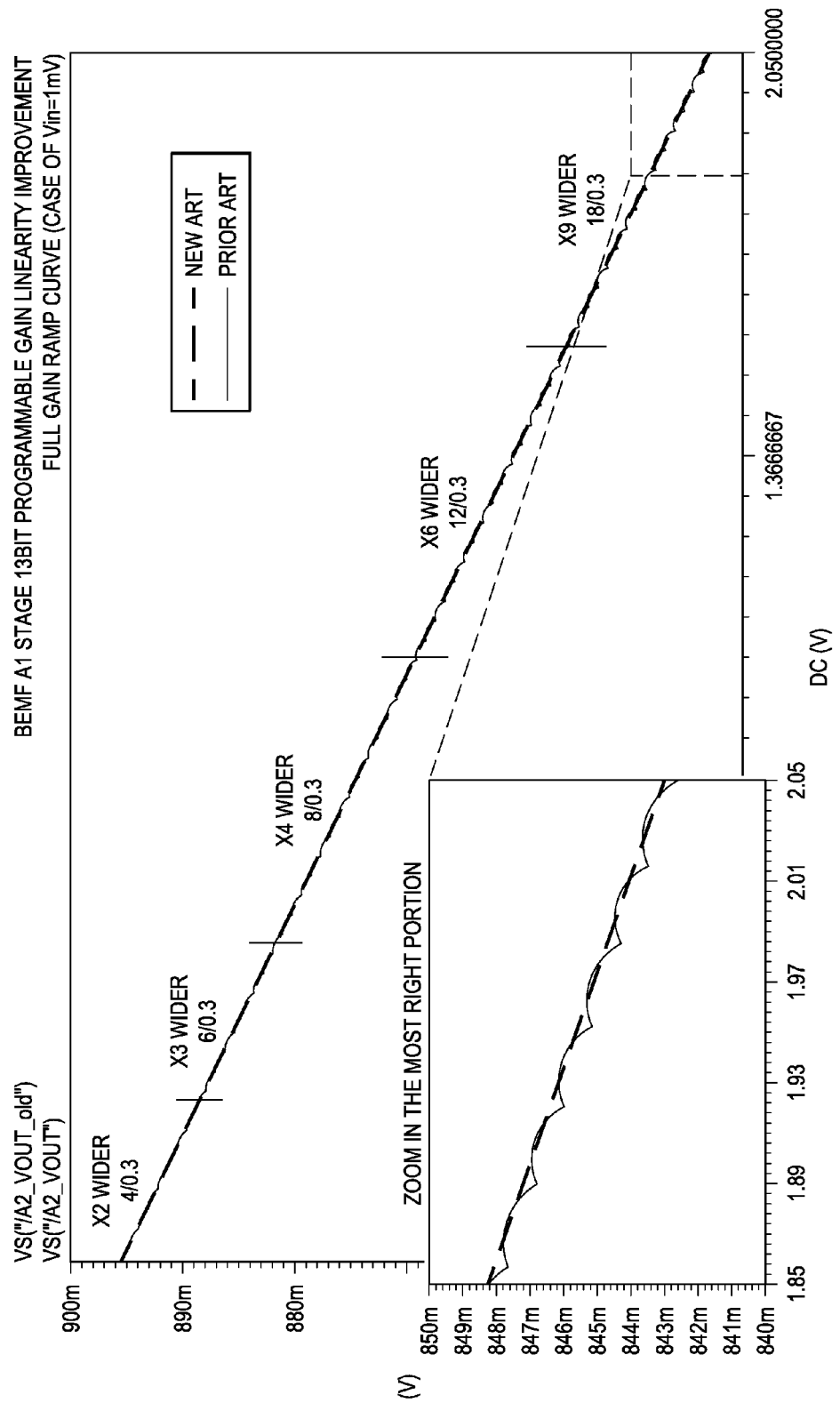
FIG. 7 illustrates a comparison between the prior art gain plot (red trace with non-linear scallop) and the new art gain plot (purple straight line) while digital gain control code is programmed from 0000H to 1FFFH.

FIG. 7 illustrates a comparison between the prior art gain plot (dashed trace) and the new art gain plot (solid trace) while digital programming code excises from 0000H to 1FFFH. The lower left portion shows the zoom-in plot of the most right portion of FIG. 6, the non-linear scallop can be clearly observed in prior art gain plot (red trace) and completely eliminated in new art gain plot (solid trace).

Those skilled in the art to which this application relates will appreciate that other and further additions, deletions, substitutions and modifications may be made to the described embodiments.

What is claimed is:

1. An apparatus including a programmable gain amplifier, the programmable gain amplifier including:
   a coarse ladder having a plurality of resistors, wherein each of the plurality of resistors are individually addressable;
   a fine ladder that is coupleable to the coarse ladder, wherein the fine ladder includes a plurality of banks of FETs, each bank including a plurality of FETs, and
   a fine ladder controller, wherein the each of the plurality of banks of the fine ladder are controllable by the fine ladder controller,
   wherein each of the FETs is an NFET,
   wherein a PMOS bank is coupled to a corresponding NFET bank so that the leakage current provided by the PMOS bank locally compensates for the NMOS bank back gate leakage.

2. The apparatus of claim 1, further comprising a 7 bit LSB decoder coupled to each of the banks of fine ladder.

3. The apparatus of claim 1, wherein he effective resistance of the fine ladder can be adaptively adjusted by turning on some banks of FETs and turning off other banks of FETS, based on which coarse ladder resistor is coupled (shunted) with the fine ladder.

4. The apparatus of claim 3, wherein the effective resistance of the fine ladder is adjusted in such way that the ratio between the fine ladder resistance and the coupled (shunted) coarse ladder resistor is relatively a constant.

5. The apparatus of claim 1, wherein the individual FETs of the banks of the fine ladder all have substantially similar characteristics due to a same batch of manufacturing.

6. A system comprising:
   a first amplifier having a first gain, the first amplifier including
      a coarse ladder having a plurality of resistors, wherein each of the plurality of resistors are individually addressable;
      a fine ladder that is coupled to the coarse ladder, wherein the fine ladder includes a plurality of banks of FETs, each bank including a plurality of FETs, and
      a fine ladder controller, wherein the each of the plurality of banks of the fine ladder are controllable by the fine ladder controller,
   wherein each of the FETs is an NFET,
   wherein a PMOS bank is coupled to a corresponding NFET bank so that the leakage current provided by the PMOS bank locally compensates for the NMOS bank back gate leakage.

7. The system of claim 6, wherein a gain of the first amplifier is adjustable so that an output of the summer is substantially zero.

8. The apparatus of claim 6, further comprising a 7 bit LSB decoder coupled to each of the banks of fine ladder.

9. The apparatus of claim 6, wherein two banks of the fine ladder have a lower net resistance when both banks are enabled compared to the case when only one of bank of the fine ladder is enabled.

10. The apparatus of claim 9, wherein a PMOS is coupled to a corresponding NFET.

11. The apparatus of claim 6, wherein the individual FETs of the banks of the fine ladder all have substantially similar characteristics due to a same batch of manufacturing.

12. A system including comprising:
    a first amplifier having a first gain, the first amplifier including
       a coarse ladder having a plurality of resistors, wherein each of the plurality of resistors are individually addressable;
       a fine ladder that is coupled to the coarse ladder, wherein the fine ladder includes a plurality of banks of FETs, each bank including a plurality of FETs, and
       a fine ladder controller, wherein the each of the plurality of banks of the fine ladder are controllable by the fine ladder controller,
    wherein, each of the FETs is an NFET,
    wherein a PMOS is coupled to each corresponding NFET,
    wherein a PMOS bank is coupled to a corresponding NFET bank so that the leakage current provided by the PMOS bank locally compensates for the NMOS bank back gate leakage.

13. The system of claim 12, wherein a gain of the first amplifier is adjustable so that an output of the summer is substantially zero.

14. The apparatus of claim 12, wherein two banks of the fine ladder have a lower net resistance when both banks are enabled compared to the case when only one of bank of the fine ladder is enabled.

* * * * *